United States Patent
Kim

(10) Patent No.: US 11,853,601 B2
(45) Date of Patent: Dec. 26, 2023

(54) NONVOLATILE MEMORY DEVICE SUPPORTING PROTECTION MODE AND MEMORY SYSTEM INCLUDING THE SAME

(71) Applicant: SK hynix Inc., Gyeonggi-do (KR)

(72) Inventor: Do Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 107 days.

(21) Appl. No.: 17/347,799

(22) Filed: Jun. 15, 2021

(65) Prior Publication Data

US 2022/0236914 A1 Jul. 28, 2022

(30) Foreign Application Priority Data

Jan. 26, 2021 (KR) ........................ 10-2021-0010747

(51) Int. Cl.
| | |
|---|---|
| *G06F 3/06* | (2006.01) |
| *G11C 16/10* | (2006.01) |
| *G11C 16/04* | (2006.01) |
| *G11C 16/26* | (2006.01) |
| *G11C 11/56* | (2006.01) |

(52) U.S. Cl.
CPC ............ *G06F 3/0659* (2013.01); *G06F 3/064* (2013.01); *G06F 3/0619* (2013.01); *G06F 3/0634* (2013.01); *G06F 3/0679* (2013.01); *G11C 11/5628* (2013.01); *G11C 11/5642* (2013.01); *G11C 16/0483* (2013.01); *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 9,535,712 B2 | 1/2017 | Lewis | |
| 2012/0240012 A1* | 9/2012 | Weathers | G11C 29/52 714/E11.034 |
| 2014/0160842 A1* | 6/2014 | Takafuji | G11C 11/5621 365/185.03 |
| 2014/0201423 A1* | 7/2014 | Jean | G06F 12/0246 711/103 |
| 2015/0332777 A1* | 11/2015 | Yoon | G11C 11/5642 365/185.12 |
| 2020/0064897 A1* | 2/2020 | Nomura | G11C 5/144 |

FOREIGN PATENT DOCUMENTS

| | | |
|---|---|---|
| KR | 10-0875539 | 12/2008 |
| KR | 10-1991905 | 6/2019 |

* cited by examiner

*Primary Examiner* — Khoa D Doan
*Assistant Examiner* — Marwan Ayash
(74) *Attorney, Agent, or Firm* — IP & T GROUP LLP

(57) ABSTRACT

A nonvolatile memory device comprising: a first block comprising multiple single level cells (SLCs), a second block comprising multiple multi-level cells (MLCs), and an operation controller is suitable to perform, in response to a read command applied from an outside: a read operation using an SLC method on first data stored in the first block or a read operation using an MLC method on second data stored in the second block in a normal mode, and a read operation using the MLC method on the first data or a read operation using the SLC method on the second data in a protection mode.

20 Claims, 8 Drawing Sheets

FIG. 3
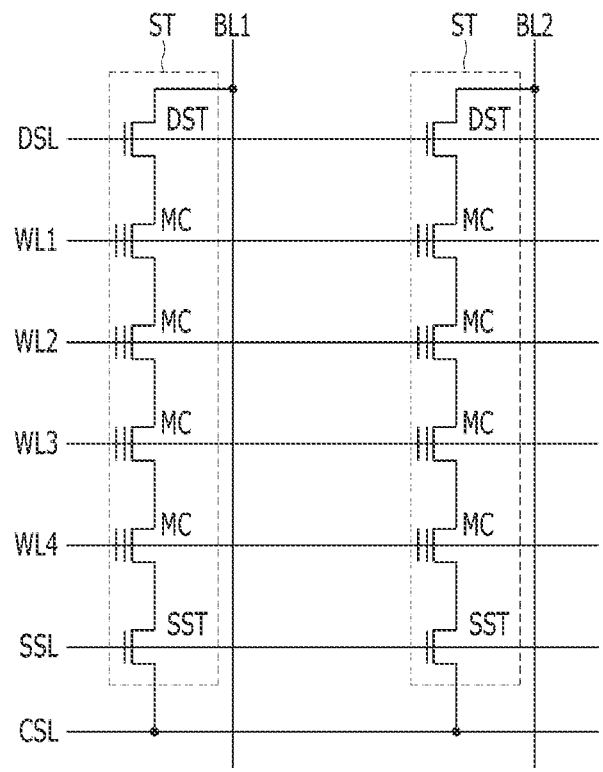
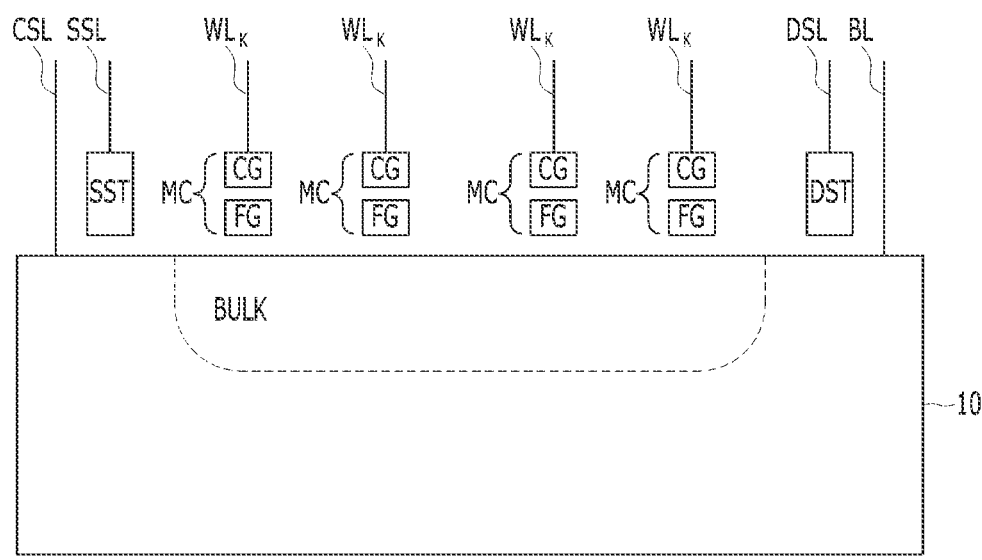

NONVOLATILE MEMORY DEVICE SUPPORTING PROTECTION MODE AND MEMORY SYSTEM INCLUDING THE SAME

CROSS-REFERENCE TO RELATED APPLICATION

This application claims priority under 35 U.S.C. § 119 to Korean Patent Application No. 10-2021-0010747, filed on Jan. 26, 2021, which is incorporated herein by reference in its entirety.

BACKGROUND

1 Field

One or more embodiments described herein relate to a nonvolatile memory device supporting a protection mode and a memory system including a nonvolatile memory device.

2 Discussion of the Related Art

Many portable devices use memories to store data. Unlike a hard disk, a semiconductor memory has excellent stability and durability because it has no mechanical driving parts, e.g., mechanical arm. It also has high data access speed and low power consumption. Examples include a universal serial bus memory device, a memory card having various interfaces, and a solid state drive (SSD).

SUMMARY

One or more embodiments described herein provide a memory device including divided mufti-level cell (MLC) and single level cell (SLC) regions for storing data.

One or more additional embodiments provide a memory system which includes such a memory device, and/or which can effectively enter a protection mode without erasing stored data.

Technical objects to be achieved in the present disclosure are not limited to the aforementioned technical object, and other technical objects not described above may be evidently understood from the following description by a person having ordinary skill in the art to which the present disclosure pertains.

In accordance with an embodiment of the present invention, a nonvolatile memory device may include: a first block comprising multiple single level cells (SLCs); a second block comprising multiple multi-level cells (MLCs); and an operation controller may be suitable to perform, in response to a read command applied from an outside: a read operation using an SLC method on first data stored in the first block or a read operation using an MLC method on second data stored in the second block in a normal mode, and a read operation using the MLC method on the first data or a read operation using the SLC method on the second data in a protection mode.

The read operation using the SLC method may include generating one first read voltage and performing a read operation once using a level of the generated first read voltage as a criterion to determine a data value, and the read operation using the MLC method may include generating at least two second read voltages in a set sequence one-by-one and consecutively and repeatedly performing, at least twice, a read operation using a level of each of the generated second read voltages as a criterion to determine a data value.

When a read address received along with the read command indicates the first block in the protection mode, the operation controller may be suitable to: decode the read command in an MLC sequence, and consecutively perform at least two read operations based on levels of the at least two second read voltages, respectively, in order to determine a value of the first data.

When the read address received along with the read command indicates the second block in the protection mode, the operation controller may be suitable to: decode the read command in an SLC sequence, and perform one read operation based on a level of the one first read voltage in order to determine a value of the second data.

When a read address received along with the read command indicates the first block in the normal mode, the operation controller may be suitable to: decode the read command in the SLC sequence, and perform one read operation based on a level of the one first read voltage in order to determine a value of the first data.

When the read address received along with the read command indicates the second block in the normal mode, the operation controller may be suitable to: decode the read command in the MLC sequence, and consecutively perform at least two read operations based on levels of the at least two second read voltages, respectively, in order to determine a value of the second data.

When a program command and a program address are applied in the normal mode from the outside, the operation controller may be suitable to: program input data into the first block using the SLC method when the program address indicates the first block, and program input data into the second block using the MLC method when the program address indicates the second block.

When a program command is applied from the outside in the protection mode, the operation controller may be suitable to output to the outside a response signal indicating that a program operation is not available.

In accordance with an embodiment of the present invention, a memory system may include: a nonvolatile memory device comprising a first block and a second block, the first block comprising multiple single level cells (SLC) and the second block comprising multiple mufti-level cells (MLC); and a controller may be suitable to: generate and transmit an SLC read command to the nonvolatile memory device in a normal mode and generate and transmit an MLC read command to the nonvolatile memory device in a protection mode, when a read request applied by a host corresponds to the first block, and generate and transmit the MLC read command to the nonvolatile memory device in the normal mode and generate and transmit the SLC read command to the nonvolatile memory device in the protection mode, when the read request applied by the host corresponds to the second block. The nonvolatile memory device may be suitable to perform a read operation using an SLC method in response to the SLC read command and to perform a read operation using an MLC method in response to the MLC read command.

The read operation using the SLC method may include generating one first read voltage and performing a read operation once using a level of the generated first read voltage as a criterion to determine a data value, and the read operation using the MLC method may include generating at least two second read voltages in a set sequence one-by-one and consecutively and repeatedly performing, at least twice, a read operation using a level of each of the generated second read voltages as a criterion to determine a data value.

When performing the read operation using the MLC method on first data, stored in the first block, in response to the MLC read command in the protection mode, the nonvolatile memory device may be suitable to consecutively perform at least two read operations based on levels of the at least two second read voltages, respectively, to determine a value of the first data.

When performing the read operation using the SLC method on second data, stored in the second block, in response to the SLC read command in the protection mode, the nonvolatile memory device may be suitable to perform one read operation based on a level of the one first read voltage to determine a value of the second data.

When performing the read operation using the SLC method on the first data in response to the SLC read command in the normal mode, the nonvolatile memory device may be suitable to perform one read operation based on a level of the one first read voltage to determine a value of the first data.

When performing the read operation using the MLC method on the second data in response to the MLC read command in the normal mode, the nonvolatile memory device may be suitable to consecutively perform at least two read operations based on levels of the at least two second read voltages, respectively, to determine a value of the second data.

The controller may be suitable to: generate and transmit an SLC program command to the nonvolatile memory device in the normal mode and to output to the host a response signal indicating that a program operation is not available in the protection mode, when a program request applied by the host corresponds to the first block, generate and transmit an MLC program command to the nonvolatile memory device in the normal mode and to output to the host a response signal indicating that a program operation is not available in the protection mode, when a program request applied by the host corresponds to the second block, and the nonvolatile memory device is suitable to perform a program operation using the SLC method in response to the SLC program command and to perform a program operation using the MLC method in response to the MLC program command.

In accordance with an embodiment of the present invention, a method of operating a nonvolatile memory device, the method may include: (a) in a normal mode, performing a read operation using a single level cell (SLC) method on first data stored in a first block comprising multiple cells or performing a read operation using a multiple-level cell (MLC) method on second data stored in a second block comprising multiple cells in response to a read command applied from the outside; and (b) in a protection mode, performing a read operation using the MLC method on the first data or performing a read operation using the SLC method on the second data in response to a read command applied from the outside.

The read operation using the SLC method may include generating one first read voltage and performing a read operation once using a level of the generated first read voltage as a criterion to determine a data value, and the read operation using the MLC method may include generating at least two second read voltages in a set sequence one-by-one and consecutively and repeatedly performing, at least twice, a read operation using a level of each of the generated second read voltages as a criterion to determine a data value.

The method (b) may include: determining a value of the first data by decoding the read command in an MLC sequence and consecutively performing at least two read operations based on levels of the at least two second read voltages, respectively, when a read address received along with the read command indicates the first block, and determining a value of the second data by decoding the read command in an SLC sequence and performing one read operation based on a level of the one first read voltage, when the read address received along with the read command indicates the second block.

The method (a) may include: determining a value of the first data by decoding the read command in the SLC sequence and performing one read operation based on a level of the one first read voltage, when a read address received along with the read command indicates the first block; and determining a value of the second data by decoding the read command in the MLC sequence and consecutively performing at least two read operations based on levels of the at least two second read voltages, respectively, when the read address received along with the read command indicates the second block.

The method may further include: receiving a program command and a program address being applied from the outside in the normal mode, and programming the first block using the SLC method when the program address indicates the first block and programming the second block by using the MLC method when the program address indicates the second block; and outputting to the outside a response signal indicating that a program operation is not available when receiving a program command is applied from the outside in the protection mode.

In accordance with an embodiment of the present invention, a nonvolatile memory device may include: a first method programmed block; and a second method programmed block. When a read request corresponding to the first method programmed block is received in a protection mode, the second method programmed block may be accessed to output data having an error.

According to this technology, in a nonvolatile memory device in which a multi-level cell (MLC) region and a single level cell (SLC) region are divided and data are stored in the MLC and SLC regions, data stored in the MLC region is read using the SLC method and data stored in the SLC region is read using the MLC method in a section in which the protection mode is entered. Accordingly, normal data can be controlled not to be read upon entry into the protection mode.

Accordingly, the leakage of data stored in the nonvolatile memory device can be prevented even in the state in which all the stored data has not been erased upon entry into the protection mode.

BRIEF DESCRIPTION OF THE DRAWINGS

FIG. 3 illustrates an embodiment of a memory block.

DETAILED DESCRIPTION

Figure 1:
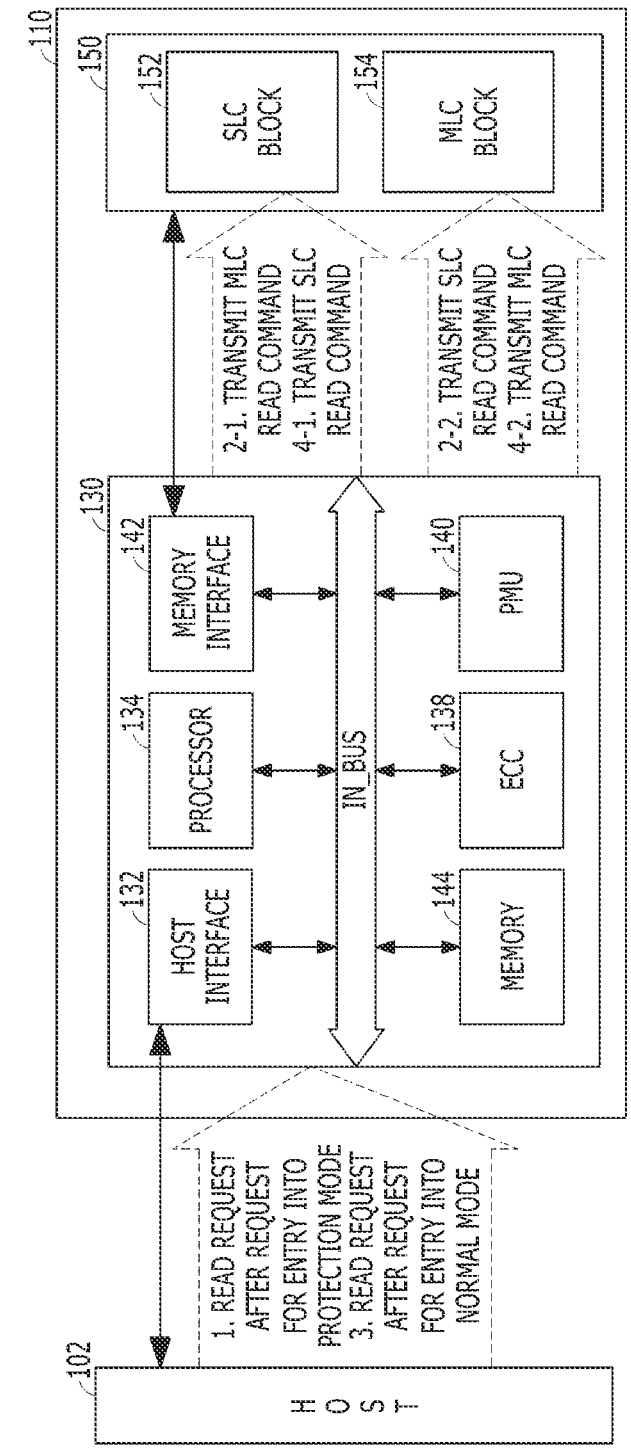
FIG. 1 illustrates an embodiment of a data processing system which performs a read operation in protection mode.

Various examples of the disclosure are described below in more detail with reference to the accompanying drawings. Aspects and features of the present invention, however, may be embodied in different ways to form other embodiments, including variations of any of the disclosed embodiments. Thus, the invention as not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include plural forms and vice versa, unless the context dearly indicates otherwise. Similarly, indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other dements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with theft meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific (details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a block diagram illustrating an embodiment of a data processing system 100, which may include a host 102 engaged or operably coupled with the memory system 110.

The host 102 may include a portable electronic device, such as a mobile phone, an MP3 player, a laptop computer, or the like, and an electronic device, such as a desktop computer, a game player, a television, or a projector. The host 102 also includes at least one operating system (OS) to manage and control functions and operations performed in the host 102. The OS can provide interoperability between the host 102 engaged with the memory system 110 and the user using the memory system 110. The OS may support functions and operations corresponding to a user request.

By way of example but not limitation, the OS can be a general operating system or a mobile operating system according to mobility of the host 102. The general operating system may be split into a personal operating system and an enterprise operating system according to system requirements or a user environment. The personal operating system (e.g., Windows, Chrome, etc.) may be subject to support services for general purposes. The enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function).

In one embodiment, the host 102 may include a plurality of operating systems. The host 102 may execute multiple operating systems interlocked with the memory system 110 corresponding to user requests. The host 102 may transmit a plurality of commands corresponding to the user requests to the memory system 110, thereby performing operations corresponding to commands within the memory system 110.

The storage devices for the memory system 110 may be implemented with a volatile memory device. Examples include a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102, and controller 130 may control operations for storing data in the memory device 150.

The controller 130 and the memory device 150 in the memory system 110 may be integrated into a single semiconductor device, which may be included in any of the various types of memory systems as discussed above in the examples. By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk.

In addition, the controller 130 and the memory device 150 may be integrated into one semiconductor device to form a memory card. Examples include a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), and a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation. The memory device 150 may include a plurality of memory blocks BLOCK<0, 1, 2, . . . >, each of which may include a plurality of pages P<0, 1, 2, 3, 4, . . . >. Each of the pages P<0, 1, 2, 3, 4, . . . > may include a plurality of memory cells to which a corresponding one of a plurality of word lines (WL) is coupled. The memory device 150 also includes a plurality of memory dies 150A, 150B, 150C, and 150D as shown in FIG. 1, each of which includes a plurality of planes. Each of the planes includes some memory blocks among the plurality of memory blocks BLOCK<0, 1, 2, . . . >. The memory device 150 may be, for example, a flash memory, having a three-dimensional stack structure.

The memory device 150 may include a plurality of memory blocks. Each of the memory blocks may be a single level cell (SLC) memory block or a mufti-level cell (MLC) memory block, according to the number of bits that can be stored or represented in one memory cell of such block. An SLC memory block includes a plurality of pages implemented by memory cells, each storing one bit of data. The SLC memory block can have high data I/O operation performance and high durability. The MLC memory block includes a plurality of pages implemented by memory cells, each storing mufti-bit data (e.g., two bits or more). The MLC memory block can have a larger storage capacity for the same space compared to an SLC memory block and can be highly integrated in terms of storage capacity.

In an embodiment, the memory device 150 may be implemented with MLC memory blocks, such as a double level cell memory block, a triple level cell (TLC) memory block, a quadruple level cell (QLC) memory block and a combination thereof. A double level memory block may include a plurality of pages implemented by memory cells, each capable of storing 2-bit data. A triple level cell (TLC) memory block may include a plurality of pages implemented by memory cells, each capable of storing 3-bit data. A quadruple level cell (QLC) memory block may include a plurality of pages implemented by memory cells, each capable of storing 4-bit data. In one embodiment, the memory device 150 may be implemented with a block including a plurality of pages implemented by memory cells, each capable of storing 5 or more bits of data.

In one embodiment, storing data of two bits in a memory cell in the MLC memory block may include the case where data of two pages are stored in one of multiple physical word lines in the MLC memory block. Storing data of three bits in a memory cell in the TLC memory block may include the case where data of three pages are stored in one of multiple physical word lines in the TLC memory block. Storing four bits in a memory cell in the QLC memory block may include the case where data of four pages are stored in one of multiple physical word lines included in the QLC memory block.

In an embodiment, the memory device 150 is a nonvolatile memory such as a flash memory that is a NAND flash memory, a NOR flash memory, or the like. In one embodiment, the memory device 150 may be at least one of a phase change random access memory (PCRAM), a ferroelectric random access memory (FRAM), and a spin injection magnetic memory (e.g., a spin transfer torque magnetic random access memory (STT-MRAM)).

The controller 130 in the memory system 110 may control the memory device 150 in response to a request from the host 102. For example, the controller 130 may provide data read from the memory device 150 to the host 102, and may store data from the host 102 in the memory device 150. Thus, the controller 130 may control read, write, program, and erase operations of the memory device 150.

The controller 130 may include a host interface 132, a processor 134, error correction code (ECC) circuitry 138, a power management unit (PMU) 140, a memory interface 142, and a memory 144. The host interface 132 may process commands and data from the host 102, and may communicate with the host 102 through at least one of various interface protocols. Example protocols include a universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI), and integrated drive electronics (IDE). In accordance with an embodiment, the host interface 132 is a component for exchanging data with the host 102, which may be implemented through firmware called a host interface layer (HIL).

The ECC component 138 can correct error bits of the data to be processed in (e.g., output from) the memory device 150, which may include an ECC encoder and an ECC decoder. The ECC encoder can perform error correction encoding of data to be programmed in the memory device 150 to generate encoded data into which a parity bit is added and store the encoded data in memory device 150. The ECC decoder can detect and correct errors contained in a data read from the memory device 150 when the controller 130 reads the data stored in the memory device 150. In other words, after performing error correction decoding on the data read from the memory device 150, the ECC component 138 can determine whether the error correction decoding has succeeded and output an instruction signal (e.g., a correction success signal or a correction fail signal). The ECC component 138 can use the parity bit which is generated during the ECC encoding process, for correcting the error bit of the read data. When the number of the error bits is greater than or equal to a threshold number of correctable error bits, the ECC component 138 might not correct error bits but instead may output an error correction fail signal indicating failure in correcting the error bits.

The ECC component 138 may perform an error correction operation based on a coded modulation. Examples include modulation based on a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component 138 may include any and all circuits, modules, systems or devices for performing the error correction operation based on at least one of the above described codes.

The PMU 140 may manage electrical power in controller 130.

The memory interface 142 may serve as an interface for handling commands and data transferred between the controller 130 and the memory device 150, to allow the controller 130 to control the memory device 150 in response to requests from the host 102. The memory interface 142 may generate a control signal for the memory device 150 and may process data entered into or output from the memory device 150 under the control of the processor 134 when the memory device 150 is a flash memory and, in particular but not exclusively, when the memory device 150 is a NAND flash memory. The memory interface 142 can provide an interface for handling commands and data between the controller 130 and the memory device 150, for example, operations of NAND flash interface, in particular but not exclusively, operations between the controller 130 and the memory device 150. In accordance with an embodiment, the memory interface 142 can be implemented through firmware called a Hash Interface Layer (FIL) as a component for exchanging data with the memory device 150.

The memory 144 may support operations performed by the memory system 110 and the controller 130. The memory 144 may store temporary or transactional data provided or delivered for operations in the memory system 110 and the controller 130. The controller 130 may control the memory device 150 in response to a request from the host 102. The controller 130 may deliver data read from the memory device 150 to the host 102. The controller 130 may store data entered through the host 102 within the memory device 150. The memory 144 may be used to store data for the controller 130 and the memory device 150 in order to perform operations such as read operations or program/write operations or erase operation.

When the controller 130 controls read, write, program, and erase operations of the memory device 150, data to be transferred or generated between the controller 130 and the memory device 150 in the memory system 110 may be stored in the memory 144. For example, the memory 144 may store data to perform data write and read operations between the host 102 and the memory device 150 and data when performing the data write and read operations. For such data storage, the memory 144 may include a program memory, a data memory, a write buffer/cache, a read buffer cache, a data buffer/cache, a map buffer/cache, and so forth.

The memory 144 may be a volatile memory. For example, the memory 144 may be a static random access memory (SRAM) or a dynamic random access memory (DRAM). The memory 144 may exist inside the controller 130 as illustrated in the drawing. In one embodiment, the memory 144 may exist outside of and coupled to the controller 130. In this case, the memory 144 may be an external volatile memory to exchange data with the controller 130 through a separate memory interface.

The processor 134 may control overall operation of the memory system 110. For example, the processor 134 may control a program operation or a read operation for the memory device 150, in response to a write request or a read request from the host 102. The processor 134 drives firmware (which may include a flash translation layer (FTL)) to control general operations of the memory system 110. The processor 134 may be, for example, a microprocessor or a central processing unit (CPU).

The controller 130 may perform an operation requested from the host 102 in the memory device 150. For example, the controller 130 may perform a command operation corresponding to a command received from the host 102, with the memory device 150, through the processor 134 embodied by a microprocessor or a central processing unit (CPU). The controller 130 may perform a foreground operation as a command operation corresponding to a command from the host 102. In one embodiment, the controller 130 may perform a program operation corresponding to a write command, a read operation corresponding to a read command, an erase operation corresponding to an erase command, or a parameter set operation corresponding to a set parameter command or a set feature command as a set command.

According to an embodiment, the processor 134 in controller 130 may generate an MLC read command or an SLC read command in response to the read request 1 or 3 transmitted by the host 102. The SLC read command or MLC read command may be transferred (2-1 or 2-2 or 4-1 or 4-2) to the memory device 150 through the memory interface 142.

The controller 130 may perform a background operation for the memory device 150 through the processor 134. The background operation for the memory device 150 may include an operation of copying data stored in a memory block (among the memory blocks 152, 154 and 156 of the memory device 150) to another memory block, for example, a garbage collection (GC) operation. The background operation may include an operation of swapping data between one or more of the memory blocks 152, 154 and 156 of the memory device 150, for example, a wear leveling (WL) operation and a read reclaim (RR) operation.

The background operation may include an operation of storing map data retrieved from the controller 130 in the memory blocks 152, 154 and 156 of the memory device 150, for example, a map flush operation. The background operation may include a bad management operation for the memory device 150, which may include checking for and processing a bad block among the plurality of memory blocks 152, 154 and 156 in the memory device 150.

Within the processor 134 of the controller 130, a component for performing bad block management for the memory device 150 may be included. Such component performs bad block management of checking for a bad block among the memory blocks 152, 154 and 156 and processing the identified bad block as a bad. Through bad block management, a memory block in which a program fail has occurred is processed as a bad memory block and program-failed data is written in a new memory block. The bad block management may be performed when a program fail may occur when performing data write (or program), due to the characteristic of the memory device 150 (e.g., a NAND flash memory). Examples of program, read, and erase operations of the controller 130 will be described as follows.

The controller 130 may store program data, corresponding to a program (or write) command from the host 102, in a buffer/cache in the memory 144 of the controller 130, and then may store the data, stored in the buffer/cache, in the memory blocks BLOCK<0, 1, 2, . . . > in the memory device 150. In one embodiment, when the program command is input from the host 102, the controller 130 may perform the program operation corresponding to the program command. At this time, the controller 130 may store the program data, corresponding to the program command, in at least one of the memory blocks BLOCK<0, 1, 2, . . . > in the memory device 150, for example, empty memory blocks where the erase operation has been performed, open memory blocks, or free memory blocks among the memory blocks BLOCK<0, 1, 2, . . . >.

Also, the controller 130 may update map data corresponding to the program operation performed on the memory device 150, and then may store the updated map data in the memory blocks BLOCK<0, 1, 2, . . . > in the memory device 150. In one embodiment, the controller 130 may store logical to physical address information (L2P mapping information) and physical to logical address information (P2L mapping information) on user data stored in the memory blocks BLOCK<0, 1, 2, . . . >, in the form of a map table or map list, in empty memory blocks, open memory blocks, or free memory blocks among the memory blocks BLOCK<0, 1, 2, . . . > in memory device 150.

When a read command is input from the host 102, the controller 130 may check map data corresponding to a logical address inputted with the read command to find a physical address corresponding to the logical address, and read data corresponding to the read command from the memory device 150 based on the physical address. Subsequently, the controller 130 may store the read data in the buffer/cache in the memory 144 of the controller 130, and then provide the host 102 with the data stored in the buffer/cache.

When an erase command is input from the host 102, the controller 130 may perform the erase operation of checking a memory block corresponding to the erase command, erasing data stored in the checked memory block, updating map data corresponding to the erased data, and then storing the updated map data in the memory blocks BLOCK<0, 1, 2, . . . > in the memory device 150.

The map data may include, for example, logical to physical (L2P) information and physical to logical (P2L) information on data stored in the memory blocks BLOCK<0, 1, 2, . . . >, corresponding to the program operation.

The data corresponding to the commands may include user data and meta data generated by the controller 130. The meta data may include map data generated by the controller 130 and corresponding to the user data stored in the memory device 150. In addition, the meta data may include information on commands inputted from the host 102, information on command operations corresponding to the commands, information on memory blocks of the memory device 150 on which the command operations are performed, and information on map data corresponding to the command operations. In one embodiment, the meta data may include information and data for the command operations except for the user data corresponding to the commands inputted from the host 102. As described above, the meta data may be generated from inside the controller 130.

According to an embodiment, some of the multiple memory blocks 152 and 154 in the memory device 150 in memory system 110 may be classified as an SLC block 152 and some may be classified as an MLC block 154. In this case, the MLC block may be classified as a TLC block. In this case, the SLC block 152 may correspond to a single level cell (MLC) memory block. The TLC block 154 may correspond to a triple level cell (TLC) memory block. Although the MLC block may be a TLC block, this is merely an embodiment and may be classified as another MLC memory block in another embodiment.

Referring to FIG. 1, the host 102 may request the memory system 110 to enter the protection mode, that is, to exit from the normal mode (1). After the memory system 110 enters the protection mode, the host 102 may request a read operation (1).

In such a state, after entry into the protection mode, when the read request 1 applied by the host 102 corresponds to the SLC block 152 (including multiple SLCs among the multiple memory blocks 152 and 154 in memory device 150), the controller 130 in the memory system 110 may generate and transmit an MLC read command to the memory device 150 (2-1).

Furthermore, after the entry into the protection mode, when the read request 1 applied by the host 102 corresponds to the MLC block 154 (including multiple MLCs, among the multiple memory blocks 152 and 154 in the memory device 150), the controller 130 may generate and transmit an SLC read command to the memory device 150 (2-2).

Furthermore, the host 102 may request the memory system 110 to exist from the protection mode, that is, to enter the normal mode, (3). Furthermore, after the memory system 110 enters the normal mode, the host 102 may request a read operation (3).

In such a state, after entry into the normal mode, when the read request 1 applied by the host 102 corresponds to the SLC block 152 (including multiple SLCs, among the multiple memory blocks 152 and 154 in the memory device 150), the controller 130 in the memory system 110 may generate and transmit an SLC read command to the memory device 150 (4-1).

Furthermore, after entry into the normal mode, when the read request 1 applied by the host 102 corresponds to the MLC block 154 (including multiple MLCs, among the multiple memory blocks 152 and 154 in the memory device 150), the controller 130 may generate and transmit an MLC read command to the memory device 150 (2-2).

Furthermore, the memory device 150 may perform a read operation using the MLC method in response to the MLC read command, and may perform a read operation using the SLC method in response to the SLC read command.

Figure 4:
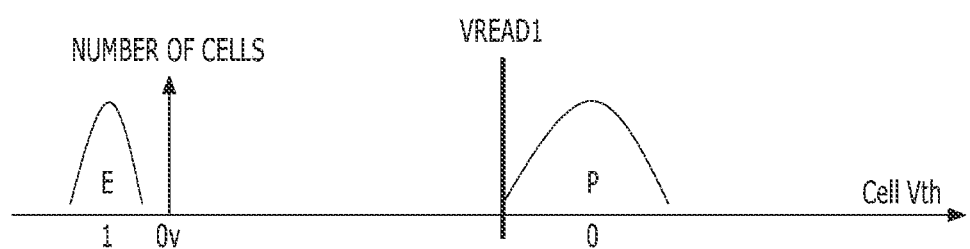
FIG. 4 illustrates an embodiment of a read operation based on an SLC method.
Figure 5:
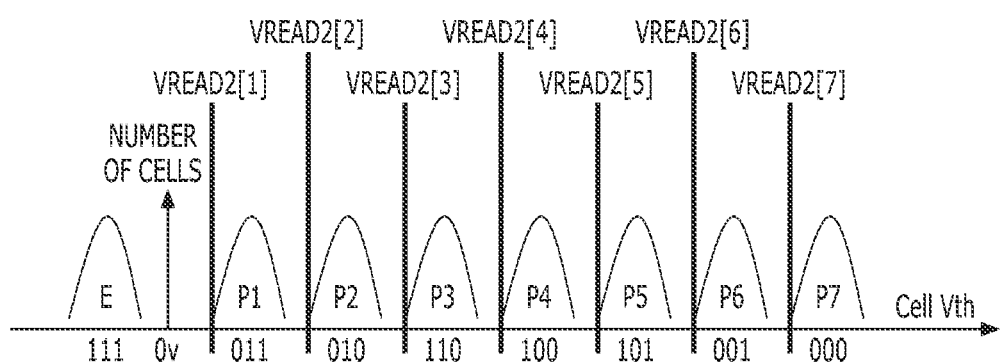
FIG. 5 illustrates an embodiment of a read operation based on an MLC method.

A configuration of each of the multiple memory blocks 152 and 154 in the memory device 150 and a difference between the read operation using the SLC method and the read operation using the MLC method may be understood with reference to FIGS. 3 to 5.

First, referring to FIG. 3, each of the multiple memory blocks 152 and 154 in the memory device 150 may include a plurality of strings ST, a plurality of bit lines BL1 and BL2 each coupled to one end of each of the plurality of strings ST, and a common source line CSL coupled to the other end of each of the plurality of strings ST in common, FIG. 3 illustrates a case where two strings ST and two bit lines BL1 and BL2 are present, but the number of strings and the number of bit lines coupled to each string may be variously changed.

Each of the two strings ST may include a source select transistor SST, a plurality of memory cells MC and a drain select transistor DST connected in series. In this case, each of the memory cells MC may have a structure in which a floating gate FG and a control gate CG are stacked on the bulk of a semiconductor substrate 10. Corresponding control gates CG of the respective strings ST are coupled to form one word line WL. Memory cells MC sharing one word line WL may be controlled by the corresponding word line WL.

Furthermore, the drain select transistor DST may control a connection between corresponding strings ST and corresponding bit lines BL1 and BL2. In this case, the gates of the drain select transistors DST may be coupled to form one drain select line DSL. Furthermore, the source select transistor SST may control a connection between a corresponding string ST and the common source line CSL. The gates of the source select transistors SST may be coupled to form one source select line SSL.

In the memory device 150, each of the memory cell MC may have an erase state or a program state depending on the execution of erase/program cycling.

Referring to FIG. 4, if each of the memory cells MC is an SLC, the memory cell may have the erase state or one program state depending on the execution of erase/program cycling. For example, programmed memory cells may have a distribution of read voltages, such as "P", and not-programmed (e.g., erased) memory cells may have a distribution of read voltages, such as "E." In the case of an SLC, one program state P and the erase state E may be distinguished using one read voltage VREAD1. Accordingly, in the SLC, a level of one first read voltage VREAD1 may be set as a proper level by which one program state P and the erase state E may be distinguished.

Accordingly, a read operation using the SLC method may include once performing a read operation of generating one first read voltage VREAD1 and using a level of the generated one first read voltage VREAD1 as a criterion for determining a data value. For example, as shown, data of a memory cell programmed to have a level lower than a level of the first read voltage VREAD1 may be determined to have the erase state E. Data of a memory cell programmed to have a level higher than a level of the first read voltage VREAD1 may be determined to have the program state P. For example, in the read operation using the SLC method, a data value of the memory cells MC (e.g., a read target) may be determined (E or P) to be "1" or "0" through one determination operation based on one first read voltage VREAD1.

Referring to FIG. 5, if each of the memory cells MC is an MLC, the memory cell may have the erase state or a plurality of program states depending on the execution of erase/program cycling. For example, if an MLC is assumed to be a triple level cell (TLC), programmed memory cells may have a distribution of read voltages (such as first to seventh program states P[1:7]) and not-programmed (e.g., erased) memory cells may have a distribution of read voltages, such as "E." If an MLC is assumed to be a TLC, the seven program states P[1:7] and one erase state E may be distinguished using seven second read voltages VREAD2[[1:7]. Accordingly, in the case where the MLC is assumed to be a TLC, the level of each of the seven second read voltages VREAD2[[1:7] may be set as a level by which the seven program states P[1:7] and the one erase state E may be distinguished.

Accordingly, a read operation using the MLC method may include consecutively and repeatedly performing, at least twice, a read operation of generating at least two second read voltages VREAD2[1:7], one-by-one, in a set sequence and using a level of each of the generated second read voltages VREAD2[1:7] as a criterion for determining a data value. For example, as shown, memory cells MC corresponding to one erase state E have a distribution of threshold voltages having a level lower than a level of the $1^{st}$ second read voltage VREAD2[1]. Memory cells MC corresponding to a first program state P1 have a distribution of threshold voltages having a level higher than the $1^{st}$ second read voltage VREAD2[1]. Accordingly, through a determination operation based on the $1^{st}$ second read voltage VREAD2[1], a data value of the memory cells MC corresponding to the erase state E and the memory cells MC corresponding to the first program state P1 may be determined (E or P1) to be "111" or "011."

Furthermore, memory cells MC corresponding to the first program state P1 have a distribution of threshold voltages having a level lower than the $2^{nd}$ second read voltage VREAD2[2], and memory cells MC corresponding to a second program state P2 have a distribution of threshold voltages having a level higher than the $2^{nd}$ second read voltage VREAD2[2]. Accordingly, through a determination operation based on the $2^{nd}$ second read voltage VREAD2[2], a data value of the memory cells MC corresponding to the first program state P1 and the memory cells MC corresponding to the second program state P2 may be determined (P1 or P2) to be "011" or "010." In such a manner, through a determination operation based on the $3^{rd}$ second read voltage VREAD2[3], a data value of the memory cells MC corresponding to the second program state P2 and memory cells MC corresponding to a third program state P3 may be determined (P2 or P3) to be "010" or "110."

Through a determination operation based on the $4^{th}$ second read voltage VREAD2[4], a data value of the memory cells MC corresponding to the third program state P3 and memory cells MC corresponding to a fourth program state P4 may be determined (P3 or P4) to be "110" or "100."

Through a determination operation based on the $5^{th}$ second read voltage VREAD2[5], a data value of the memory cells MC corresponding to the fourth program state P4 and memory cells MC corresponding to a fifth program state P5 may be determined (P4 or P5) to be "100" or "101."

Through a determination operation based on the $6^{th}$ second read voltage VREAD2[6], a data value of the memory cells MC corresponding to the fifth program state P5 and memory cells MC corresponding to a sixth program state P6 may be determined (P5 or P6) to be "101" or "001."

Through a determination operation based on the $7^{th}$ second read voltage VREAD2[7], a data value of the memory cells MC corresponding to the sixth program state P6 and memory cells MC corresponding to a seventh program state P7 may be determined (P6 or P7) to be "001" or "000."

Thus, in a read operation in which an MLC is assumed to be a TLC, through the seven determination operations based on the seven second read voltages VREAD2[1:7], a data value of memory cells MC (e.g., a read target) may be determined (E or P1 or P2 or P3 or P4 or P5 or P6 or P7) to be "111", "011", "010", "110", "100", "101", "001", or "000."

For reference, as a threshold voltage of a programmed memory cell MC becomes higher (e.g., a state of the threshold becomes the seventh program state P7), it may be considered that a large amount of charges are stored in the floating gate FG of the memory cell MC. Furthermore, upon read operation, by applying the seven second read voltages VREAD2[1:7] to the control gate CG of a memory cell MC (e.g., a read target), a state of data stored in the memory cell MC (e.g., erase state E or one of the first to seventh program states P[1:7]) may be read. Furthermore, in the read operation using the MLC method, the set sequence for generating the at least two second read voltages VREAD2[1:7] may be determined in various ways depending on the type of memory device 150 or a method of controlling the memory device 150.

Referring back to FIG. 1, when performing a read operation using the MLC method on first data (stored in the SLC block 152) in response to the MLC read command 2-1 applied by the controller 130 in protection mode, the memory device 150 may consecutively perform at least two read operations based on levels of the at least two second read voltages, respectively, in order to determine a value of the first data stored in the SLC block 152.

When performing a read operation using the SLC method on second data (stored in the MLC block 154) in response to the SLC read command 2-2 applied by the controller 130 in protection mode, the memory device 150 may perform one read operation based on a level of one first read voltage, in order to determine a value of the second data stored in the MLC block 154.

For example, referring to FIGS. 1 and 3 to 5, states of the first data stored in the SLC block 152 may be classified into the program state P and the erase state E. Through one determination operation based on one first read voltage VREAD1, a data value of the memory cells MC (e.g., a read target) may be determined to be "1" or "0." Furthermore, states of the second data stored in the MLC block 154 may be classified into the seven program states P[1:7] and the one erase state E. Through seven determination operations based on the seven second read voltages VREAD2[1:7], data values of memory cells MC (e.g., read target) may be determined to be "111", "011", "010", "110", "100", "101", "001", and "000."

Furthermore, when performing a read operation using the SLC method on the first data (stored in the SLC block 152) in response to the SLC read command 4-1 applied by controller 130 in the normal mode, the memory device 150 may perform one read operation based on a level of one first read voltage, in order to determine a value of the first data stored in the SLC block 152.

When performing a read operation using the MLC method on the second data (stored in the MLC block 154) in response to the MLC read command 4-2 applied by the controller 130 in the normal mode, the memory device 150 may consecutively perform at least two read operations based on levels of the at least two second read voltages, respectively, in order to determine a value of the second data stored in the MLC block 154.

When a value of the first data stored in the SLC block 152 is determined in the protection mode, if the seven determination operations based on the seven second read voltages VREAD2[1:7] are performed through read operations using the MLC method, the value of the first data stored in the SLC block 152 may be determined to be a strange value, which is quite different from a value stored through a program and may not be able to be predicted.

On the contrary, when a value of the first data stored in the SLC block 152 is determined in the normal mode, the value of the first data stored in SLC block 152 can be accurately determined to be a value stored through a program when one determination operation based on one first read voltage VREAD1 is performed through a read operation using the SLC method.

When a value of the second data stored in the MLC block 154 is determined, if only one determination operation based on one first read voltage VREAD1 is performed through a read operation using the SLC method, the value of the second data stored in the MLC block 154 may be determined to be a strange value, which is quite different from a value stored through a program and can never be predicted. On the contrary, when a value of the second data stored in the MLC block 154 is determined in the normal mode, if the seven determination operations based on the seven second read voltages VREAD2[1:7] are performed through read operations using the MLC method, the value of the second data stored in the MLC block 154 can be accurately determined to be a value stored through a program.

Thus, when the read request 1 applied by the host 102 corresponds to the SLC block 152 including multiple SLCs (among the multiple memory blocks 152 and 154 in the memory device 150 in the normal mode), the controller 130 may read the first data (stored in the SLC block 152) normally through the operation (4-1) of generating and transmitting an SLC read command to the memory device 150. On the contrary, after entry into the protection mode, when the read request 1 applied by the host 102 corresponds to the SLC block 152, including multiple SLCs (among the multiple memory blocks 152 and 154 included in the memory device 150), the controller 130 may prevent the first data (stored in the SLC block 152) from being read normally through the operation 2-1 of generating and transmitting an MLC read command to the memory device 150.

Likewise, in normal mode, when the read request 1 applied by the host 102 corresponds to the MLC block 154 including multiple MLCs (among the multiple memory blocks 152 and 154 in memory device 150), the controller 130 may read the second data (stored in the MLC block 154) normally through the operation 2-2 of generating and transmitting an MLC read command to the memory device 150. On the contrary, after entry into the protection mode, when the read request 1 applied by the host 102 corresponds to the MLC block 154 including multiple MLCs (among the multiple memory blocks 152 and 154 in the memory device 150), the controller 130 may enable the second data (stored in the MLC block 154) not to be read normally through the operation 2-2 of generating and transmitting an SLC read command to the memory device 150.

Thus, in protection mode, the controller 130 may confirm to which memory block the read request 1 applied by the host 102 corresponds among the multiple memory blocks 152 and 154 in the memory device 150, and may control the type of read command (transmitted to the memory device 150) differently from the type of read command in the normal mode based on a result of the confirmation, so that programmed data cannot be read normally.

When a program request applied by the host 102 corresponds to the SLC block 152 including multiple SLCs (among the multiple memory blocks 152 and 154 in the memory device 150), the controller 130 in the memory system 110 may generate and transmit an SLC program command to the memory device 150 in the normal mode, and may output a response signal indicating that a program operation is not possible, to the host 102, in the protection mode.

Likewise, when a program request applied by the host 102 corresponds to the MLC block 154 including multiple MLCs (among the multiple memory blocks 152 and 154 in the memory device 150), the controller 130 in the memory system 110 may generate and transmit an MLC program command to the memory device 150 in the normal mode, and may output a response signal indicating that a program operation is not possible to the host 102 in the protection mode.

Furthermore, the memory device 150 may perform a program operation using the MLC method in response to the MLC program command, and may perform a program operation using the SLC method in response to the SLC program command.

Figure 2:
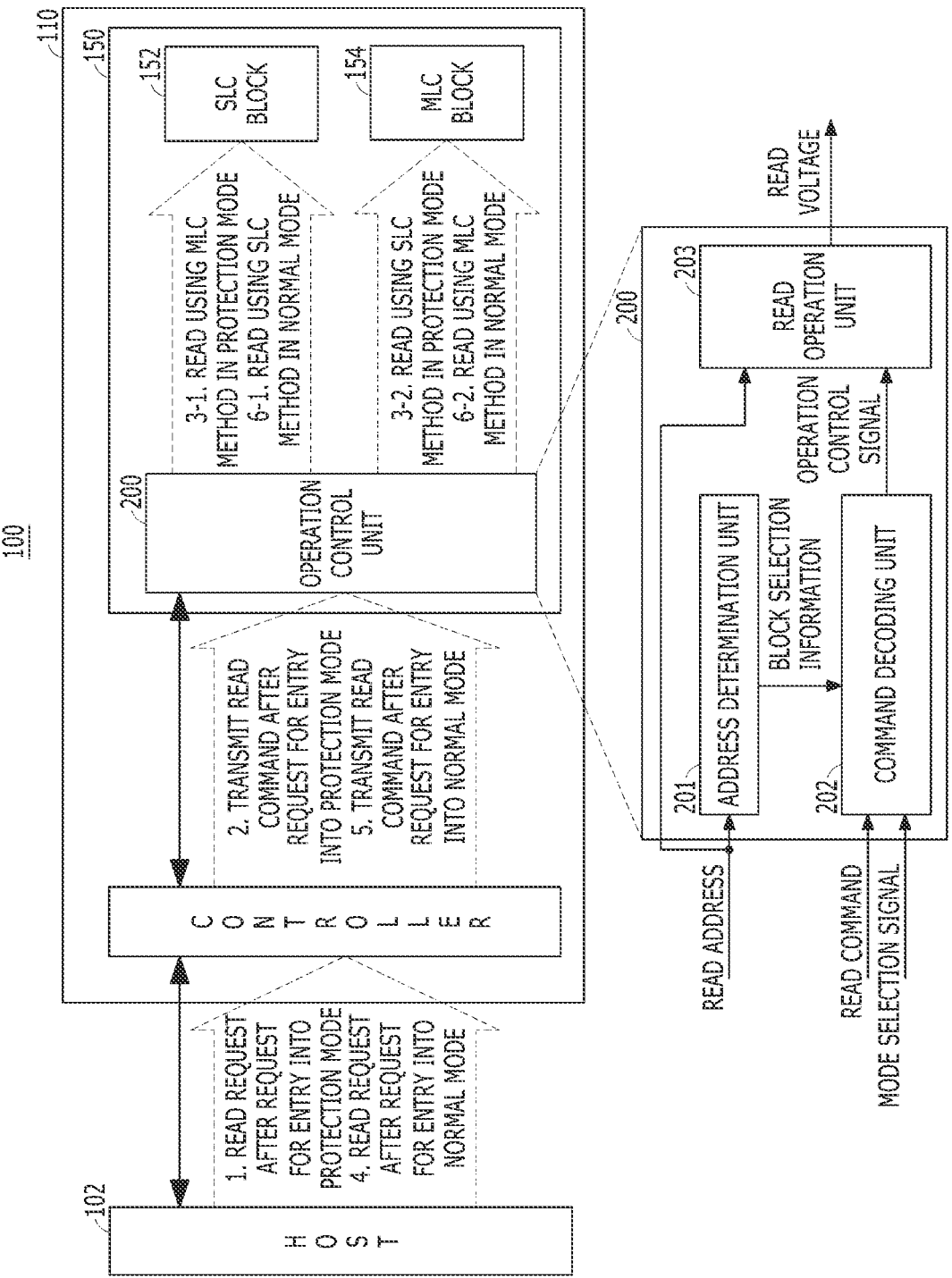
FIG. 2 illustrates an embodiment of a data processing system which performs a read operation in protection mode.

FIG. 2 is a block diagram of an embodiment of a data processing system 100 configured to perform a read operation in a protection mode. As with the previously embodiment. As with the previous embodiment, data processing system 100 may be a volatile or a nonvolatile memory device in a memory system.

The configurations of the host 102 and memory system 110 in the data processing system 100 of FIG. 2 may be almost the same as those of host 102 and memory system 110 in the data processing system 100 of FIG. 1. For example, elements 132, 134, 138, 140, 142, and 144 of the controller 130 in the memory system 110 of FIG. 1 may be the same as in the controller 130 of FIG. 2. Also, many of the operation of the controller 130 of FIG. 1 may be the same as controller 130 of FIG. 2.

However, operations of the controller 130 and the memory device 150 in the memory system 110 of FIG. 2 may be partially different from operations of the controller 130 and memory device 150 in the memory system 110 of FIG. 1. In some embodiments, controller 130 may perform the operation of generating an MLC read command or an SLC read command in response to a read request from the host 102 and then transmitting the MLC read command or the SLC read command to memory device 150. In the embodiment of FIG. 2, the controller 130 may perform an operation of generating a read command in response to a read request from the host 102 and transmitting the read command to memory device 150.

Furthermore, FIG. 1 illustrates that only the multiple memory blocks 152 and 154 are in the memory device 150. In contrast, in the embodiment of FIG. 2, an operation control unit (i.e., an operation controller) 200 (which performs a characteristic operation as described below) may be in the memory device 150, in addition to the multiple memory blocks 152 and 154. Furthermore, operation control unit (or operation controller) 200 may include an address determination unit (or address determination logic) 201, a command decoding unit (or command decoder) 202, and a read operation unit (or read operator) 203.

For example, the host 102 may request the memory system 110 to enter the protection mode, e.g., to exit the normal mode (1). After the memory system 110 enters the protection mode, the host 102 may request a read operation (1).

In such a state, the controller 130 in the memory system 110 may request the memory device 150 to enter the protection mode, e.g., exit the normal mode (2). After the memory device 150 enters the protection mode, the controller 130 may generate a read command in response to the read request from the host 102 and may transmit the generated read command to the memory device 150 (2).

After entering the protection mode in response to the request from the controller 130, the operation control unit 200 in the memory device 150 may perform a read operation using the MLC method on first data, stored in the SLC block 152, in response to the read command applied by the controller 130 (3-1).

After entering the protection mode in response to the request from the controller 130, the operation control unit 200 may perform a read operation using the MLC method on second data, stored in the MLC block 154, in response to the read command applied by the controller 130 (3-2).

The host 102 may request the memory system 110 to enter the normal mode, e.g., to exit the protection mode (4). After the memory system 110 enters the normal mode, the host 102 may request a read operation (4).

In such a state, the controller 130 may request the memory device 150 to enter the normal mode, e.g., to exit from the protection mode (5). Furthermore, after the memory device 150 enters the normal mode, the controller 130 may generate a read command in response to the read request from the host 102, and may transmit the generated read command to the memory device 150 (5).

After entering the normal mode in response to the request from the controller 130, the operation control unit 200 may perform a read operation using the SLC method on the first data, stored in the SLC block 152, in response to the read command applied by the controller 130 (6-1).

After entering the normal mode in response to the request from the controller 130, the operation control unit 200 may perform a read operation using the MLC method on the second data, stored in the MLC block 154, in response to the read command applied by the controller 130 (6-2).

For example, the address determination unit 201 may generate block selection information indicating whether a read address received along with the read command from the controller 130 indicates the SLC block 152 or the MLC block 154.

The command decoding unit 202 may enter the normal mode or the protection mode in response to a mode selection signal received from the controller 130. Accordingly, the command decoding unit 202 may generate an operation control signal by decoding the read command in an SLC sequence or an MLC sequence in response to the mode selection signal from the controller 130 and the block selection information from the address determination unit 201.

The read operation unit 203 may generate a read voltage in response to the operation control signal from the command decoding unit 202. The read operation unit 203 may then perform a read operation on the memory block 152 or 154 based on the read voltage and the read address received from the controller 130, either in an SLC manner or an MLC manner as discussed.

Thus, the controller 130 may transmit a read command to the memory device 150 even when the controller 130 has entered the protection mode, and may transmit a read command to the memory device 150 even when the controller 130 has entered the normal mode, in response to a read request from the host 102.

In one embodiment, the read commands transmitted from the controller 130 to the memory device 150 may have the same characteristic regardless of whether the mode is the normal mode or the protection mode. However, when the controller 130 transmits the read command to the memory device 150, a read address may also be transmitted. The operation control unit 200 may perform a read operation using the SLC method or a read operation using the MLC method depending on a memory block indicated by the read address, among the multiple memory blocks 152 and 154.

The configuration of each of the multiple memory blocks 152 and 154 and a difference between the read operation using the SLC method and the read operation using the MLC method can be understood, for example, with reference to FIGS. 3 to 5 and as has already been described with reference to FIG. 1.

For example, it has been described with reference to FIG. 4 that the read operation using the SLC method may include once performing a read operation of generating one first read voltage VREAD1 and using a level of the generated one first read voltage VREAD1 as a criterion for determining a data value. Furthermore, it has been described with reference to FIG. 5 that the read operation using the MLC method may include consecutively and repeatedly performing, at least twice, a read operation of generating the at least two second read voltages VREAD2[1:7], one-by-one, in a set sequence and using a level of each of the generated second read voltages VREAD2[1:7] as a criterion for determining a data value.

Referring again to FIG. 2, after entry into the protection mode, when a read address received with the read command applied by the controller 130 indicates the SLC block 152, the operation control unit 200 may decode the read command, applied by the controller 130, in the MLC sequence and may perform a read operation using the MLC method on the SLC block 152.

As described above, the operation control unit 200 may decode the read command in the MLC sequence and may consecutively perform at least two read operations based on levels of the at least two second read voltages, respectively, in order to determine a value of the first data stored in the SLC block 152 corresponding to the read address.

For example, when it is determined that the read address indicates the SLC block 152, the address determination unit 201 may generate block selection information corresponding to the SLC block 152 and may transmit the generated block selection information to the command decoding unit 202. Furthermore, the command decoding unit 202 may be in a state where the command decoding unit 202 has entered the protection mode in response to a mode selection signal. Accordingly, the command decoding unit 202 may generate an operation control signal by decoding the read command in the MLC sequence in response to the block selection information corresponding to the SLC block 152.

The read operation unit 203 may generate at least two second read voltages to perform a read operation using the MLC method in response to the operation control signal from the command decoding unit 202. The read operation unit 203 may then perform the read operation using the MLC method on the SLC block 152, e.g., may consecutively perform at least two read operations based on levels of the at least two second read voltages, respectively, in order to determine a value of the first data stored in the SLC block 152, by using the generated at least two second read voltages.

After an entry into the protection mode, when a read address received with a read command applied by the controller 130 indicates the MLC block 154, the operation control unit 200 may decode the read command, applied by the controller 130, in the SLC sequence. The operational control unit 200 may then perform a read operation using the SLC method on the MLC block 154.

As described above, the operation control unit 200 may decode the read command in the SLC sequence and then may perform one read operation based on a level of one first read voltage in order to determine a value of the second data stored in the MLC block 154 corresponding to the read address. For example, when it is determined that the read address indicates the MLC block 154, the address determination unit 201 may generate block selection information corresponding to the MLC block 154 and then may transmit the generated block selection information to the command decoding unit 202.

Furthermore, the command decoding unit 202 may be in a state in which the command decoding unit 202 has entered the protection mode in response to a mode selection signal. Accordingly, the command decoding unit 202 may generate an operation control signal by decoding the read command in the SLC sequence in response to the block selection information corresponding to the MLC block 154.

Furthermore, the read operation unit 203 may generate one first read voltage in order to perform a read operation using the SLC method in response to the operation control signal received from the command decoding unit 202. The read operation unit 203 may then perform a read operation using the SLC method on the MLC block 154, e.g., one read operation based on the level of the one first read voltage, in order to determine a value of the second data stored in the MLC block 154 using the generated one first read voltage.

For example, referring to FIGS. 2 and 3 to 5, the first data stored in the SLC block 152 may be classified into the program state P and the erase state E. A data value of memory cells MC (e.g., a read target) may be determined to be "1" or "0" through one determination operation based on one first read voltage VREAD1. Furthermore, the second data stored in the MLC block 154 may be classified into the seven program states P[1:7] and the one erase state E. Data values of memory cells MC (e.g., a read target) may be determined to be "111", "011", "010", "110", "100", "101", "001", and "000" through seven determination operations based on the seven second read voltages VREAD2[1:7].

After an entry into the normal mode, when a read address received along with a read command applied by the controller 130 indicates the SLC block 152, the operation control unit 200 may decode the read command (applied by the controller 130 in the SLC sequence) and may perform a read operation using the SLC method on the SLC block 152.

As described above, the operation control unit 200 may decode the read command in the SLC sequence and may perform one read operation based on a level of one first read voltage in order to determine a value of the first data stored in the SLC block 152 corresponding to the read address. For example, when the read address indicates the SLC block 152, the address determination unit 201 may generate block selection information corresponding to the SLC block 152 and may transmit the generated block selection information to the command decoding unit 202.

The command decoding unit 202 may be in a state in which the command decoding unit 202 has entered the normal mode in response to a mode selection signal. Accordingly, the command decoding unit 202 may generate an operation control signal by decoding the read command in the SLC sequence in response to the block selection information corresponding to the SLC block 152.

The read operation unit 203 may generate one first read voltage in order to perform a read operation using the SLC method in response to the operation control signal received from the command decoding unit 202. The read operation unit 203 may then perform a read operation using the SLC method on the SLC block 152 (e.g., one read operation based on the level of one first read voltage) in order to determine a value of the first data stored in the SLC block 152 using the generated one first read voltage.

After an entry into the normal mode, when a read address received with a read command applied by the controller 130 indicates the MLC block 154, the operation control unit 200 may decode the read command, applied by the controller 130, in the MLC sequence. The operation control unit 200 may then perform a read operation using the MLC method on the MLC block 154.

As described above, the operation control unit 200 may decode the read command in the MLC sequence and may consecutively perform at least two read operations based on levels of at least two second read voltages, respectively, in order to determine a value of the second data stored in the MLC block 154 corresponding to the read address.

For example, when the read address indicates the MLC block 154, the address determination unit 201 may generate block selection information corresponding to the MLC block 154 and may transmit the generated block selection information to the command decoding unit 202. The command decoding unit 202 may be in a state in which the command decoding unit 202 has entered the normal mode in response to a mode selection signal. Accordingly, the command decoding unit 202 may generate an operation control signal by decoding the read command in the MLC sequence in response to the block selection information corresponding to the MLC block 154.

Furthermore, the read operation unit 203 may generate at least two second read voltages in order to perform a read operation using the MLC method in response to the operation control signal received from the command decoding unit 202. The read operation unit 203 may then perform a read operation using the MLC method on the MLC block 154, e.g., may consecutively perform at least two read operations based on levels of the at least two second read voltages, respectively, to determine a value of the second data stored in MLC block 154 using the generated at least two second read voltages.

When the value of the first data stored in the SLC block 152 is determined in the protection mode, and when the seven determination operations based on the seven second read voltages VREAD2[1:7] are performed through read operations using the MLC method, the value of the first data stored in the SLC block 152 may be determined to be a strange value, which is quite different from a value stored through a program and can never be predicted. On the contrary, when a value of the first data stored in the SLC block 152 is determined in the normal mode, and when one determination operation based on one first read voltage VREAD1 is performed through a read operation using the SLC method, the value of the first data stored in the SLC block 152 can be accurately determined to be a value stored through a program.

When the value of the second data stored in the MLC block 154 is determined, and when only one determination operation based on one first read voltage VREAD1 is performed through a read operation using the SLC method, the value of the second data stored in the MLC block 154 may be determined to be a strange value, which is quite different from a value stored through a program and can never be predicted. On the contrary, when a value of the second data stored in the MLC block 154 is determined in the normal mode, and when seven determination operations based on the seven second read voltages VREAD2[1:7] are performed through read operations using the MLC method, the value of the second data stored in the MLC block 154 can be accurately determined to be a value stored through a program.

Thus, in the normal mode, when a read address applied along with the read command 5 from the controller 130 indicates the SLC block 152, the operation control unit 200 may decode the read command, applied by the controller 130, in the SLC sequence to perform a read operation using the SLC method on the SLC block 152. As a result, the first data stored in the SLC block 152 can be read normally (6-1). On the contrary, in the protection mode, when a read address applied along with the read command 2 from the controller 130 indicates the SLC block 152, the operation control unit 200 may decode the read command, applied by the controller 130, in the MLC sequence to perform a read operation using the MLC method on the SLC block 152. As a result, the first data stored in the SLC block 152 cannot be read normally (3-1).

Likewise, in the normal mode, when a read address applied along with the read command 5 from the controller 130 indicates the MLC block 154, the operation control unit 200 may decode the read command, applied by the controller 130, in the MLC sequence to perform a read operation using the MLC method on the MLC block 154. As a result, the second data stored in the MLC block 154 can be read normally (6-2). On the contrary, in the protection mode, when a read address applied along with the read command 2 from the controller 130 indicates the MLC block 154, the operation control unit 200 may decode the read command, applied by the controller 130, in the SLC sequence to perform a read operation using the SLC method on the MLC block 154. As a result, the second data stored in the MLC block 154 cannot be read normally (3-2).

Thus, in the protection mode, the operation control unit 200 may confirm which memory block a read address applied with the read command from the controller 130 indicates among the multiple memory blocks 152 and 154. Also, the operation control unit 200 may control a method of decoding the read command, received from the controller 130, differently from a method in the normal mode based on a result of the confirmation, so that programmed data cannot be read normally.

One difference between an operation of decoding a read command in the SLC sequence and an operation of decoding the read command in the MLC sequence (by the operation control unit 200 in the memory device 150) may be understood with reference to FIG. 8.

Figure 8A:
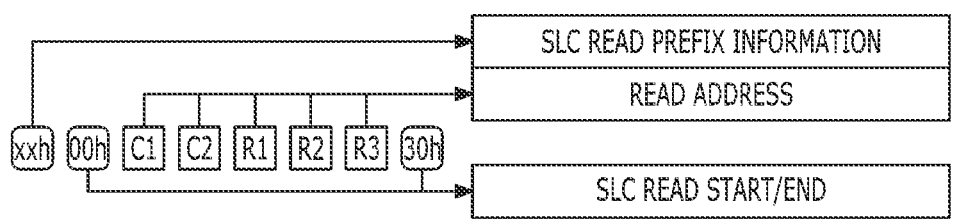
FIGS. 8A and 8B illustrate examples of a difference between an operation of decoding a read command in an SLC sequence and an operation of decoding a read command in an MLC sequence in the nonvolatile memory device according to an embodiment.
Figure 8B:
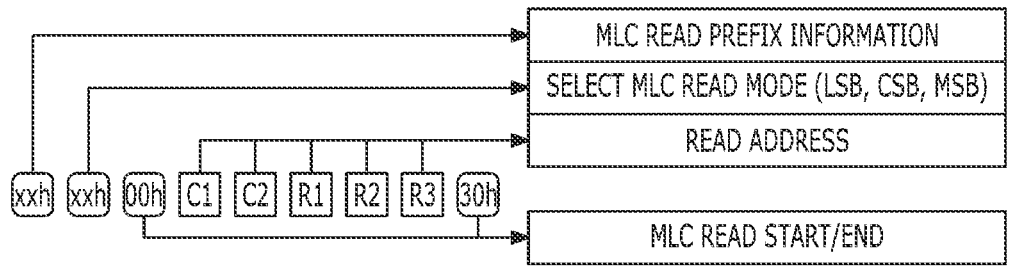

For example, based on a comparison of FIG. 8A and FIG. 8B, it may be seen that FIG. 8A correspond to a case where the read command is decoded in the SLC sequence and FIG. 8B corresponds to a case where the read command is decoded in the MLC sequence, e.g., a TLC sequence. One object of the operation of decoding the read command in the SLC sequence in FIG. 8A may be to perform a read operation using the SLC method for performing one determination operation based on a read voltage. One object of the operation of decoding the read command in the MLC sequence in FIG. 8B is to perform a read operation using the MLC method for performing at least two determination operations based on at least two read voltages. It may be seen that the method of decoding the read command in FIG. 8B may be more complicated than the method of decoding the read command in FIG. 8A.

When a program command and a program address are applied by the controller 130 in response to a request from the host 102 and the program address indicates the SLC block 152 in the normal mode, the operation control unit 200 in the memory device 150 may program input data into the SLC block 152 in the SLC manner. Furthermore, when a program command and a program address are applied by the controller 130 in response to a request from the host 102 and the program address indicates the MLC block 154 in the normal mode, the operation control unit 200 may program input data into the MLC block 154 in the MLC manner.

Furthermore, when a program command is applied by the controller 130 in response to a request from the host 102 in the protection mode, the operation control unit 200 may output, to the controller 130, a response signal indicating that a program operation is not possible. At this time, the controller 130 may transmit, to the host 102, the response signal which is received from the memory device 150 and indicates that a program operation is not possible.

Figure 6:
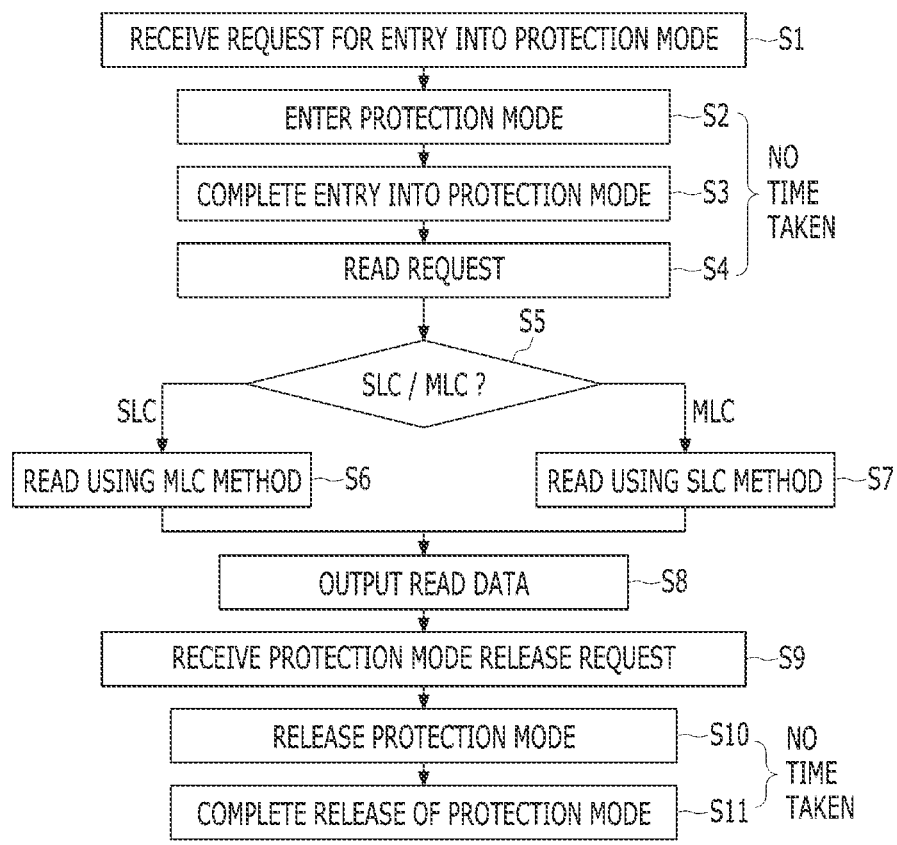
FIG. 6 illustrates an embodiment of a read operation performed in a protection mode.
Figure 7:
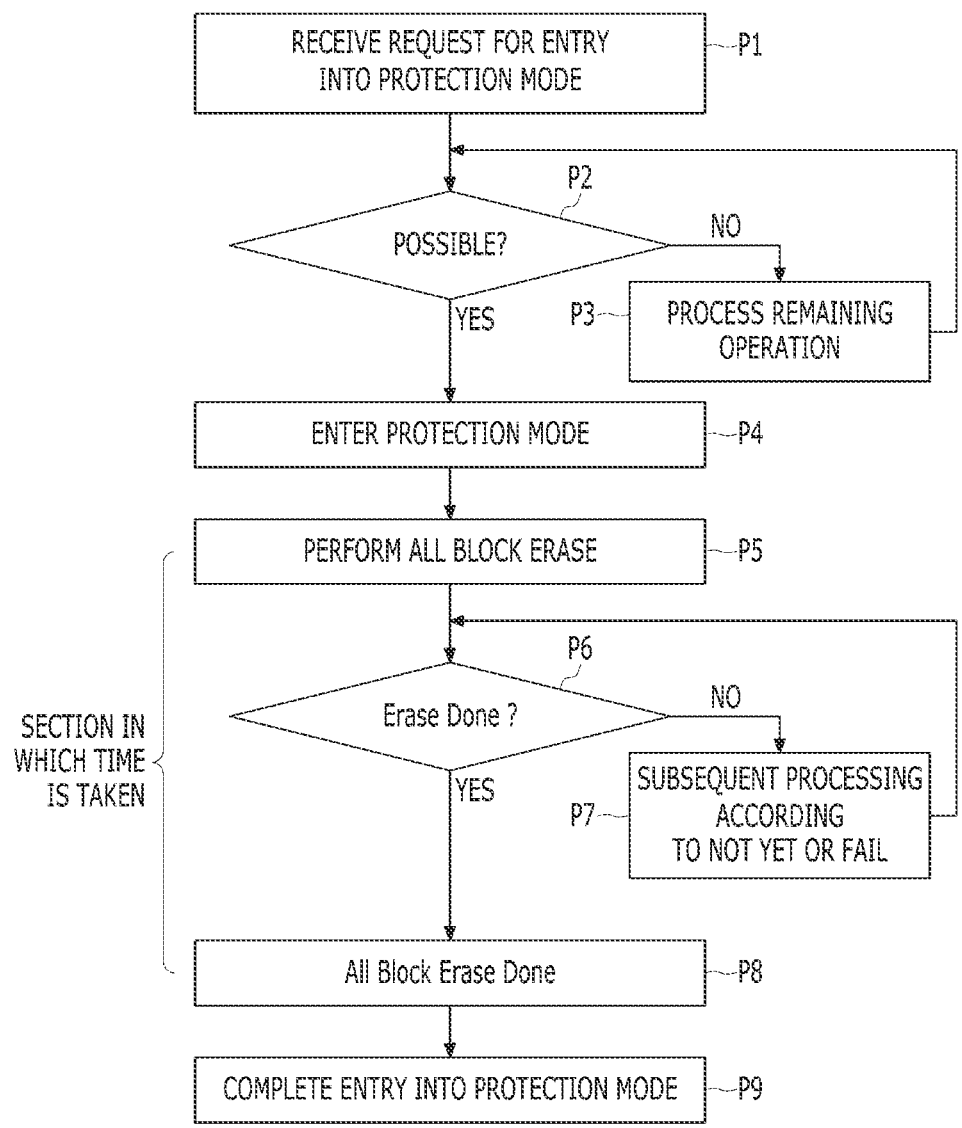
FIG. 7 illustrates an example of a read operation in accordance with one method which has been proposed, provided for comparison with one or more method embodiments described herein.

FIG. 6 is a flowchart illustrating an embodiment of a method of performing a read operation in the protection mode of a memory system, which system may correspond to the embodiments described herein. FIG. 7 is a flowchart describing a proposed method of performing a read operation in a protection mode, which proposed method may be compared to the method embodiments of performing the read operation in the protection mode of FIG. 6.

Referring to FIG. 6, when receiving a request for an entry into protection mode from the host 102 (S1), the memory system 110 according to an embodiment may immediately enter the protection mode (S2) and transmit, to the host 102, a response signal indicating that entry into the protection mode has been completed (S3). Entering into the protection mode in operation S2 may include a case where the memory system 110 exits from normal mode and enters the protection mode.

In this case, there may be almost no time taken for operations S1 to S3. This is because an additional operation performed in the memory system 110 to enter the protection mode in accordance with operation S1 (e.g., an operation such as an erase operation, a program operation or an encryption operation) does not need to be performed. The reason for this is that the memory system 110 according to an embodiment operates as follows when a read request from the host 102 occurs (S4) in the state in which the memory system 110 has entered the protection mode.

First, when the read request received from the host 102 in operation S4 is a read request for the SLC block (SLC in S5), the memory system may output read data (S8) by performing a read operation using the MLC method (S6). As described above, if a read operation using the MLC method is performed on the SLC block in the protection mode, a value of data stored in the SLC block may be determined to be a strange value, which is quite different from a value stored through a program and can never be predicted.

Likewise, when the read request received from the host 102 in operation S4 is a read request for the MLC block (MLC in S5), the memory system may output read data (S8) by performing a read operation using the SLC method (S7). As described above, if a read operation using the SLC method is performed on the MLC block in the protection mode, the value of data stored in the MLC block may be determined to be a strange value, which is quite different from a value stored through a program and can never be predicted.

That is, the read data output in the protection mode through operation S8 may always have a strange value which cannot have any meaning. Accordingly, one object of the protection mode (e.g., preventing data stored in the memory system 110 from being read normally) can be achieved.

After operation S8, when a protection mode release request is received from the host 102 (S9), the memory system 110 may immediately release the protection mode (S10) and may transmit, to the host 102, a response signal indicating that release of the protection mode has been completed (S11). Releasing the protection mode in operation S10 may include the case where the memory system 110 exits from the protection mode and enters the normal mode.

In this case, there may be almost no time taken for operations S9 to S11. This is because when the memory system 110 enters the protection mode in accordance with operations S1 to S3, additional operations performed within the memory system 110 in order to enter the protection mode (e.g., an operation such as an erase operation, a program operation or an encryption operation) has never been performed. Accordingly, after operation S11 (e.g., after the memory system 110 exists from the protection mode and enters the normal mode), the memory system 110 may read data stored in the SLC block in the SLC manner or data stored in the MLC block in the MLC manner, so that a value of data stored in the SLC block or the MLC block through a program can be read normally.

Furthermore, referring to the proposed method of FIG. 7, when receiving a request for entry into the protection mode from the host 102 (P1), the memory system may have to perform many operations P2, P3, P4, P5, P6, P7, and P8 until the memory system 110 transmits, to the host 102, a response signal indicating that the entry into the protection mode has been completed (P9).

Specifically, in the proposed method the memory system may autonomously check whether it can enter the protection mode (P2) after operation P1. For example, the memory system 110 may check whether the remaining operation performed prior to an operation in the protection mode (e.g., a read operation, a program operation or an erase operation) was being performed (P2), and may process the remaining operation if, as a result of the check, the remaining operation was being performed (P3).

If, as a result of the check, the remaining operation was not being performed, the memory system may enter the protection mode (P4). However, operations P5, P6, P7, and P8 of erasing all the multiple memory blocks 152 and 154 in the memory device 150 for the protection mode, an operation of encrypting and storing all data stored in the multiple memory blocks 152 and 154 again, etc., need to be performed between operation P4 of autonomously entering, by the memory system 110, the protection mode and operation P9 of notifying, by the memory system 110, the host 102 that the entry into the protection mode has been completed.

Operations P5, P6, P7, and P8 that need to be performed for the protection mode as described above inevitably consume a lot of time. Furthermore, returning to operations P5, P6, P7, and P8 that need to be performed for the protection mode may be impossible or may take or consume power for a very long time.

As described above, in accordance with one or more embodiments, a nonvolatile memory device is provided having divided into a mufti-level cell (MLC) and single level cell (SLC) regions. Data are then stored in the MLC and SLC regions, e.g., data stored in the MLC region is read using the SLC method and data stored in the SLC region is read using the MLC method in a section in which the protection mode is entered. As a result, normal data can be controlled not to be read upon entry into the protection mode.

Accordingly, leakage of data stored in the nonvolatile memory device can be prevented even when all the stored data has not been erased upon entry into the protection mode. As described above, the time taken for a process of entering the protection mode can be reduced or minimized because the protection mode can be entered even without erasing all data stored in the nonvolatile memory device.

Also, as described above, the time taken for a process of entering the protection mode can be reduced or minimized because the protection mode can be entered even without erasing all data stored in the nonvolatile memory device.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although various embodiments have been described for illustrative purposes, it will be apparent to those skilled in the art that various changes and modifications may be made without departing from the spirit and scope of the disclosure. The embodiments may be combined to form additional embodiments.

What is claimed is:

1. A nonvolatile memory device, comprising:
a first block comprising multiple cells;
a second block comprising multiple cells; and
an operation controller is suitable to perform:
a read operation using a multiple-level cell (MLC) method for reading first data programmed in the first block by a single level cell (SLC) method as abnormal strange value in a protection mode, in response to a read command applied from an outside,
a read operation using the SLC method for reading second data programmed in the second block by the MLC method as abnormal strange value in the protection mode, in response to the read command, and
a read operation using an SLC method on the first data or a read operation using an MLC method on the second data in a normal mode, in response to the read command.

2. The nonvolatile memory device of claim 1, wherein:
the read operation using the SLC method comprises generating one first read voltage and performing a read operation once using a level of the generated first read voltage as a criterion to determine a data value, and
the read operation using the MLC method comprises generating at least two second read voltages in a set sequence one-by-one and consecutively and repeatedly performing, at least twice, a read operation using a level of each of the generated second read voltages as a criterion to determine a data value.

3. The nonvolatile memory device of claim 2, wherein, when a read address received along with the read command indicates the first block in the protection mode, the operation controller is suitable to:
decode the read command in an MLC sequence, and
consecutively perform at least two read operations based on levels of the at least two second read voltages, respectively, in order to determine a value of the first data.

4. The nonvolatile memory device of claim 3, wherein, when the read address received along with the read command indicates the second block in the protection mode, the operation controller is suitable to:
decode the read command in an SLC sequence, and
perform one read operation based on a level of the one first read voltage in order to determine a value of the second data.

5. The nonvolatile memory device of claim 4, wherein, when a read address received along with the read command indicates the first block in the normal mode, the operation controller is suitable to:
decode the read command in the SLC sequence, and
perform one read operation based on a level of the one first read voltage in order to determine a value of the first data.

6. The nonvolatile memory device of claim 5, wherein, when the read address received along with the read command indicates the second block in the normal mode, the operation controller is suitable to:
decode the read command in the MLC sequence, and
consecutively perform at least two read operations based on levels of the at least two second read voltages, respectively, in order to determine a value of the second data.

7. The nonvolatile memory device of claim 1, wherein:
when a program command and a program address are applied in the normal mode from the outside,
the operation controller is suitable to:
program input data into the first block as the first data using the SLC method when the program address indicates the first block, and
program input data into the second block as the second data using the MLC method when the program address indicates the second block.

8. The nonvolatile memory device of claim 7, wherein, when a program command is applied from the outside in the protection mode, the operation controller is suitable to output to the outside a response signal indicating that a program operation is not available.

9. A memory system, comprising:
a nonvolatile memory device comprising a first block and a second block, the first block comprising multiple cells and the second block comprising multiple cells; and
a controller is suitable to:
generate and transmit a multiple-level cell (MLC) read command for reading first data programmed in the first block by a single level cell (SLC) method from the nonvolatile memory device as abnormal strange value in a protection mode and generate and transmit an SLC read command for reading the first data from the nonvolatile memory device in a normal mode and, when a read request applied by a host corresponds to the first block, and generate and transmit the SLC read command for reading second data programmed in the second block by MLC method from the nonvolatile memory device as abnormal strange value in the protection mode and generate and transmit the MLC read command for reading the second data from the nonvolatile memory device in the normal mode, when the read request applied by the host corresponds to the second block, and wherein the nonvolatile memory device is suitable to perform a read operation using the SLC method in response to the SLC read command and to perform a read operation using the MLC method in response to the MLC read command.

10. The memory system of claim 9, wherein:

the read operation using the SLC method comprises generating one first read voltage and performing a read operation once using a level of the generated first read voltage as a criterion to determine a data value, and the read operation using the MLC method comprises generating at least two second read voltages in a set sequence one-by-one and consecutively and repeatedly performing, at least twice, a read operation using a level of each of the generated second read voltages as a criterion to determine a data value.

11. The memory system of claim 10, wherein:

when performing the read operation using the MLC method on the first data, stored in the first block, in response to the MLC read command in the protection mode, the nonvolatile memory device is suitable to consecutively perform at least two read operations based on levels of the at least two second read voltages, respectively, to determine a value of the first data.

12. The memory system of claim 11, wherein:

when performing the read operation using the SLC method on the second data, stored in the second block, in response to the SLC read command in the protection mode, the nonvolatile memory device is suitable to perform one read operation based on a level of the one first read voltage to determine a value of the second data.

13. The memory system of claim 12, wherein:

when performing the read operation using the SLC method on the first data in response to the SLC read command in the normal mode, the nonvolatile memory device is suitable to perform one read operation based on a level of the one first read voltage to determine a value of the first data.

14. The memory system of claim 13, wherein:

when performing the read operation using the MLC method on the second data in response to the MLC read command in the normal mode, the nonvolatile memory device is suitable to consecutively perform at least two read operations based on levels of the at least two second read voltages, respectively, to determine a value of the second data.

15. The memory system of claim 9, wherein the controller is suitable to:

generate and transmit an SLC program command to the nonvolatile memory device in the normal mode and to output to the host a response signal indicating that a program operation is not available in the protection mode, when a program request applied by the host corresponds to the first block, generate and transmit an MLC program command to the nonvolatile memory device in the normal mode and to output to the host a response signal indicating that a program operation is not available in the protection mode, when a program request applied by the host corresponds to the second block, and the nonvolatile memory device is suitable to perform a program operation using the SLC method in response to the SLC program command and to perform a program operation using the MLC method in response to the MLC program command.

16. A method of operating a nonvolatile memory device, the method comprising:

(a-1) in a protection mode, performing a read operation using a multiple-level cell (MLC) method for reading first data programmed in a first block by a single level cell (SLC) method as abnormal strange value, in response to a read command applied from an outside, (a-2) in the protection mode, performing a read operation using the SLC method for reading second data programmed in a second block by the MLC method as abnormal strange value, in response to the read command, and (b) in a normal mode, performing a read operation using the SLC method on the first data or performing a read operation using the MLC method on the second data in response to the read command.

17. The method of claim 16, wherein:

the read operation using the SLC method comprises generating one first read voltage and performing a read operation once using a level of the generated first read voltage as a criterion to determine a data value, and the read operation using the MLC method comprises generating at least two second read voltages in a set sequence one-by-one and consecutively and repeatedly performing, at least twice, a read operation using a level of each of the generated second read voltages as a criterion to determine a data value.

18. The method of claim 17, wherein (a-1) comprises determining a value of the first data by decoding the read command in an MLC sequence and consecutively performing at least two read operations based on levels of the at least two second read voltages, respectively, when a read address received along with the read command indicates the first block, and wherein (a-2) comprises determining a value of the second data by decoding the read command in an SLC sequence and performing one read operation based on a level of the one first read voltage, when the read address received along with the read command indicates the second block.

19. The method of claim 18, wherein (b) comprises:

determining a value of the first data by decoding the read command in the SLC sequence and performing one read operation based on a level of the one first read voltage, when a read address received along with the read command indicates the first block; and determining a value of the second data by decoding the read command in the MLC sequence and consecutively performing at least two read operations based on levels of the at least two second read voltages, respectively, when the read address received along with the read command indicates the second block.

20. The method of claim 19, further comprising:
receiving a program command and a program address being applied from the outside in the normal mode, and programming input data into the first block as the first data using the SLC method when the program address indicates the first block and programming input data into the second block as the second data by using the MLC method when the program address indicates the second block; and
outputting to the outside a response signal indicating that a program operation is not available when receiving a program command is applied from the outside in the protection mode.

\* \* \* \* \*